(12) United States Patent
Venugopal et al.

(10) Patent No.: US 8,488,370 B2
(45) Date of Patent: Jul. 16, 2013

(54) DIFFERENTIAL THRESHOLD VOLTAGE NON-VOLATILE MEMORY AND RELATED METHODS

(75) Inventors: Sameer M. Venugopal, San Jose, CA (US); David R. Allee, Phoenix, AZ (US); Lawrence T Clark, Phoenix, AZ (US); Nazanin Darbanian, San Diego, CA (US)

(73) Assignee: Arizona Board of Regents, a body corporate of the State of Arizona, Acting for and on behalf of Arizona State University, Scottsdale, AZ (US)

( * ) Notice: Subject to any disclaimer, the term of this patent is extended or adjusted under 35 U.S.C. 154(b) by 54 days.

(21) Appl. No.: 13/083,405

(22) Filed: Apr. 8, 2011

(65) Prior Publication Data

US 2011/0261634 A1  Oct. 27, 2011

Related U.S. Application Data

(63) Continuation of application No. PCT/US2009/060176, filed on Oct. 9, 2009.

(60) Provisional application No. 61/141,505, filed on Dec. 30, 2008, provisional application No. 61/104,685, filed on Oct. 10, 2008.

(51) Int. Cl.
  *G11C 11/00*  (2006.01)
(52) U.S. Cl.
  USPC ....... 365/154; 365/156; 365/185.24; 365/190

(58) Field of Classification Search
  USPC ............ 365/154, 189.011, 156, 185.24, 190, 365/154 O
  See application file for complete search history.

(56) References Cited

U.S. PATENT DOCUMENTS

| | | | |
|---|---|---|---|
| 4,132,904 A | 1/1979 | Harari | |
| 4,527,255 A | 7/1985 | Keshtbod | |
| 5,496,756 A | 3/1996 | Sharma et al. | |
| 5,748,533 A | 5/1998 | Dunlap et al. | |
| 5,956,269 A * | 9/1999 | Ouyang et al. | 365/185.08 |
| 6,028,803 A | 2/2000 | Kopley et al. | |
| 6,122,191 A | 9/2000 | Hirose et al. | |
| 6,963,103 B2 * | 11/2005 | Forbes | 257/315 |
| 7,443,715 B2 * | 10/2008 | Forbes | 365/154 |
| 7,839,674 B2 * | 11/2010 | Lowrey et al. | 365/163 |
| 2003/0026134 A1 | 2/2003 | Lowrey | |
| 2006/0120172 A1 | 6/2006 | Lee et al. | |

OTHER PUBLICATIONS

International Search Report and Written Opinion for PCT Application No. PCT/US09/60176 (Dec. 2, 2009).
International Search Report and Written Opinion for PCT Application No. PCT/US09/60171 (Nov. 19, 2009).

* cited by examiner

*Primary Examiner* — Vanthu Nguyen
(74) *Attorney, Agent, or Firm* — Bryan Cave LLP

(57) ABSTRACT

Embodiments and examples of differential threshold voltage non-volatile memories and related methods are described herein. Other embodiments, examples thereof, and related methods are also disclosed herein.

40 Claims, 8 Drawing Sheets

(Read)

(Write)

DIFFERENTIAL THRESHOLD VOLTAGE NON-VOLATILE MEMORY AND RELATED METHODS

CROSS REFERENCE TO RELATED APPLICATION

This application is a continuation application to PCT Patent Application PCT/US09/60176, filed on Oct. 9, 2009, which claims priority from U.S. Provisional Patent Application 61/141,505, filed on Dec. 30, 2008, and from U.S. Provisional Patent Application 61/104,685, filed on Oct. 10, 2008. The contents of the applications listed above are incorporated herein by reference.

STATEMENT REGARDING FEDERALLY SPONSORED RESEARCH OR DEVELOPMENT

The disclosure herein was funded with government support under grant number W911NF-04-2-0005, awarded by the Army Research Laboratory. The United States Government may have certain rights in this invention.

FIELD OF THE INVENTION

This invention relates generally to non-volatile memories, and relates more particularly to differential threshold voltage non-volatile memories and related methods.

BACKGROUND

The development of thin film transistor technology has been beneficial for the enablement of several integrated circuit applications, such as in the manufacture of integrated display circuits. Modern day electronics, however, often require the use of memory devices, such as non-volatile memory arrays, to enable ever more complex features or operations of such integrated circuits. The addition of memory devices, however, often adds to the cost and complexity of such electronics. For example, adding memory to integrated circuits often requires the coupling of external and/or non-integrated memory modules. In other examples, the memory may be integrated as part of the integrated circuit, but the semiconductor process flow used to fabricate the integrated circuit needs to be altered with additional steps, thereby increasing cost and complexity during manufacture.

Therefore, a need exists to develop non-volatile memories and related methods that can be integrated with electronics, such as with integrated circuits that comprise thin film transistors, without requiring significant modifications to established manufacturing techniques and/or without requiring external couplings to separate memory devices.

BRIEF DESCRIPTION OF THE DRAWINGS

The invention will be better understood from a reading of the following detailed description of examples of embodiments, taken in conjunction with the accompanying figures in the drawings in which.

Figure 1:
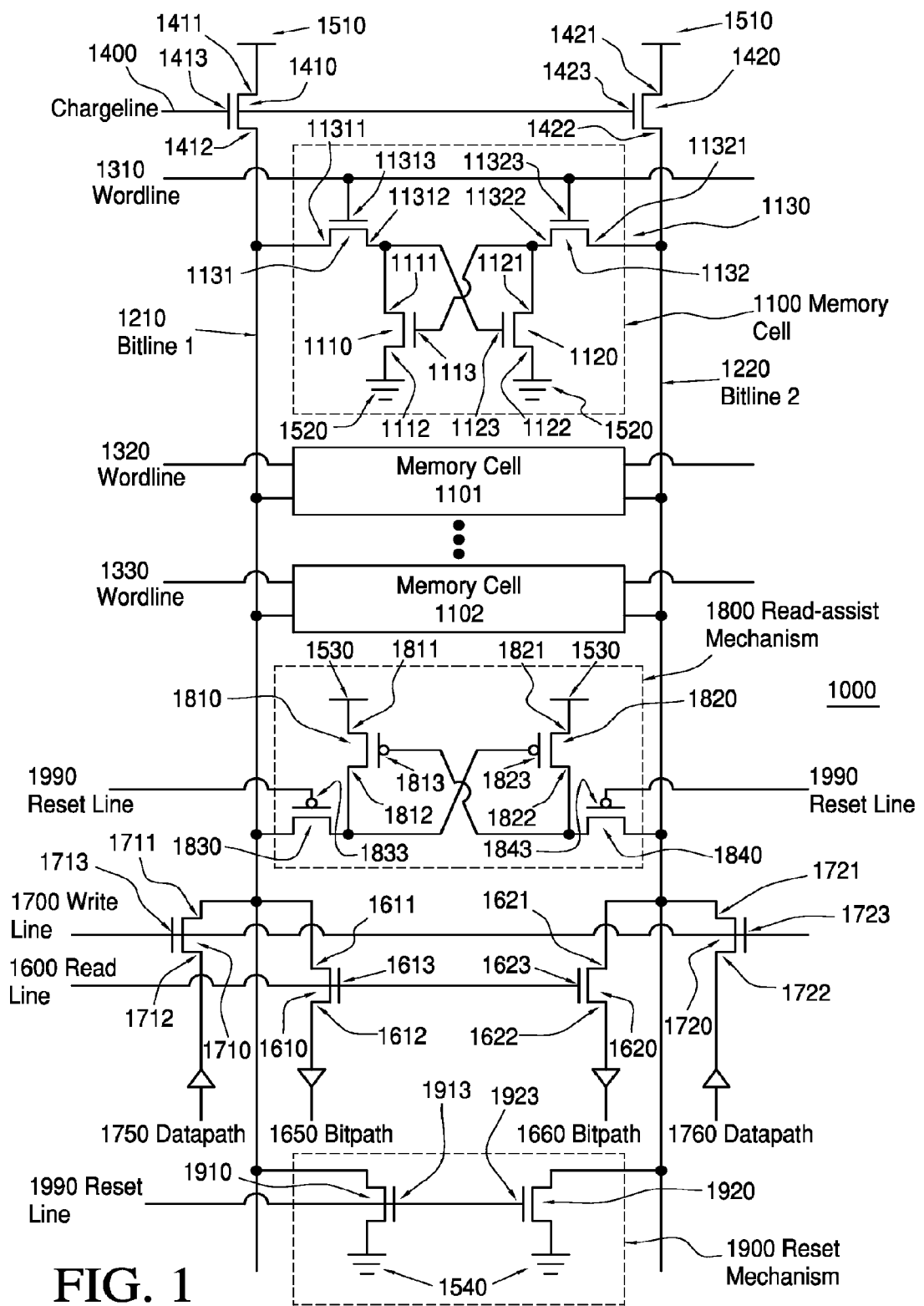
FIG. 1 illustrates a schematic of a first memory circuit in accordance with a first embodiment of the present disclosure.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically and/or otherwise. Two or more electrical elements may be electrically coupled together but not be mechanically or otherwise coupled together; two or more mechanical elements may be mechanically coupled together, but not be electrically or otherwise coupled together; two or more electrical elements may be mechanically coupled together, but not be electrically or otherwise coupled together. Coupling may be for any length of time, e.g., permanent or semi-permanent or only for an instant.

An electrical "coupling" and the like should be broadly understood and include coupling involving any electrical signal, whether a power signal, a data signal, and/or other types or combinations of electrical signals. A mechanical "coupling" and the like should be broadly understood and include mechanical coupling of all types. The absence of the word "removably," "removable," and the like near the word "coupled," and the like does not mean that the coupling, etc. in question is or is not removable.

DETAILED DESCRIPTION

In one embodiment of a memory circuit, the memory circuit includes a memory cell, which comprises a first transistor and a second transistor. The first transistor comprises a first threshold voltage, and the second transistor comprises a second threshold voltage. The first and second transistors are cross-coupled together, and a difference between the first and second threshold voltages corresponds to a logic state of the memory cell.

In one example of a method of operating a memory cell comprising a first transistor cross-coupled with a second transistor, the method can comprise reading the memory cell by determining a threshold voltage difference between the first and second transistors. The method can also comprise writing to the memory cell by degrading one of a threshold voltage of the first transistor, or a threshold voltage of the second transistor.

In a second embodiment, a memory circuit can comprise a first bitline, a second bitline, and a memory cell coupled to the first and second bitlines. The memory cell can comprise a first transistor comprising a first threshold voltage, and a second transistor comprising a second threshold voltage, where the first and second transistors of the memory cell are cross-coupled together. The memory circuit can also comprise a read assist mechanism configured to couple to the memory cell via the first and second bitlines, and/or a memory reset mechanism configured to couple to the memory cell via the first and second bitlines. A difference between the first and second threshold voltages can correspond to a logic state of the memory cell.

In second example of a method of operating a memory cell comprising a first transistor cross-coupled with a second transistor, the method can comprise reading the memory cell by determining a threshold voltage difference between the first and second transistors of the memory cell. The method can also comprise enabling a read assist mechanism, and/or enabling a memory reset mechanism.

Referring to the figures, FIG. 1 illustrates a schematic of a memory circuit 1000 in accordance with one embodiment of the present disclosure. Memory circuit 1000 comprises memory cell 1100, where memory cell 1100 comprises transistors 1110 and 1120 cross-coupled together. As an example, terminal 1111 of transistor 1110 is coupled to terminal 1123 of transistor 1120, and terminal 1121 of transistor 1120 is coupled to terminal 1113 of transistor 1110 in the present embodiment.

In the same or a different embodiment, the transistors of the memory circuit can comprise field-effect transistors. In the present example, terminal 1113 comprises a control terminal of transistor 1110, and terminal 1123 comprises a control terminal of transistor 1120. In the same or a different embodiment, the control terminals could be referred to as gate terminals. Although transistors 1110 and 1120 are shown as N-type Metal-Oxide Semiconductor (NMOS) transistors in the present embodiment, other embodiments may comprise P-type Metal-Oxide Semiconductor (PMOS) transistors instead.

Transistor 1110 comprises a threshold voltage that must be overcome, by an applied voltage at terminal 1113, in order to enable or activate transistor 1110. Similarly, transistor 1120 comprises a threshold voltage that must be overcome, by an applied voltage at terminal 1123, in order to enable or activate transistor 1120. In the present embodiment, a difference between the threshold voltage of transistor 1110 and the threshold voltage of transistor 1120 can correspond to a logic state of memory cell 1100. As an example, if the threshold voltage of transistor 1110 is greater than the threshold voltage of transistor 1120, the logic state of memory cell 1100 could be considered to be an asserted state or mode. Conversely, if the threshold voltage of transistor 1120 is greater than the threshold voltage of transistor 1110, the logic state of memory cell 1100 could be considered to be a de-asserted state or mode. Similarly, in a different embodiment, a memory cell similar to memory cell 1100 could be considered to be in an asserted state or mode if the threshold voltage of transistor 1120 were greater than the threshold voltage of transistor 1110, and could conversely be considered to be in a de-asserted state or mode if the threshold voltage of transistor 1110 were greater than the threshold voltage of transistor 1120. Because the difference between the threshold voltages of transistors 1110 and 1120 remains unchanged when memory circuit 1000 is devoid of power, memory cell can be considered a type of non-volatile memory that retains its asserted or de-asserted state or mode when unpowered.

In the present embodiment, transistors 1110 and 1120 comprise thin film transistors subject to electrical stress-degradation of their conducting channels. For example, terminal 1113 of transistor 1110 can be exposed to a write voltage throughout a write time to thereby degrade the threshold voltage of transistor 1110. In some embodiments, the threshold voltage of transistor 1110 could degrade when exposed to the write voltage due to a charge injection into a gate insulator of transistor 1110, and/or due to a generation of defect states in the conducting channel of transistor 1110. Similar mechanisms could be used to degrade the threshold voltage of transistor 1120 when desired. As a result, the threshold voltages of transistors 1110 and 1120 can be degraded relative to each other to alter the difference between them and to thereby alter the logic state of memory cell 1100. As an example, if memory cell 1100 were in the asserted state, with the threshold voltage of transistor 1110 greater than the threshold voltage of transistor 1120, then memory cell 1100 could be toggled to the de-asserted state by degrading the threshold voltage of transistor 1120 and thereby make the threshold voltage of transistor 1120 greater than the threshold voltage of transistor 1110.

In some embodiments, continued exposure to the write voltage can sufficiently degrade the threshold voltages of one or more of transistors 1110 and/or 1120 to render memory cell 1100 inoperable. For example, the threshold voltage of transistor 1110 may become so degraded that transistor 1110 may not turn on when memory cell 1100 is read, thus yielding a false logic value for memory cell 1100. In the same or different examples, transistors 1110 and/or 1120 can be configured to withstand at least approximately 10 to 1000 write cycles, where at least one of transistors 1110 and/or 11120 is exposed to the write voltage at each write cycle, before memory cell 1100 becomes inoperable.

In the present embodiment, memory circuit 1000 also comprises wordline 1310, bitline 1210, and bitline 1220. Memory circuit can also comprise a plurality of memory cells, such as memory cells 1100, 1101, and 1102, where memory cells 1101 and/or 1102 can be similar or identical to memory cell 1100. In the present embodiment, memory cell 1100 is accessible via bitlines 1210 and 1220 when wordline 1310 is enabled. Similarly, memory cells 1101 and 1102 are accessible when wordlines 1320 and 1330, respectively, are enabled. Other memory cells of the plurality of memory cells can be similarly coupled as part of memory circuit 1000. In the present example, memory cells 1100, 1101, and 1102 can form respective portions of different rows of part of a column of memory cells in memory circuit 1000. Memory circuit 1000 can have numerous columns and rows of memory cells.

In some embodiments, wordlines of memory circuit 1000, such as wordlines 1310, 1320, and 1330, can be controlled through a mechanism (not shown) comprising a decoder to enable or disable specific wordlines leading to corresponding memory cells of memory circuit 1000.

Memory cell 1100 comprises access mechanism 1130, configured to make memory cell 1100 accessible to bitlines 1210 and 1220. In the present example, access mechanism 1130 includes transistors 1131 and 1132, which comprise control terminals 11313 and 11323, respectively, coupled to wordline 1310. Terminal 11311 of transistor 1131 is coupled to bitline 1210, and terminal 11321 is coupled to bitline 1220. In addition, terminal 11312 of transistor 1131 is coupled to terminal 1111 of transistor 1110 and to control terminal 1123 of transistor 1120, while terminal 11322 of transistor 1132 is coupled to terminal 1121 of transistor 1120 and to control terminal 1113 of transistor 1110. As a result, when wordline 1310 actuates control terminals 11313 and 11323 of transistors 1131 and 1132, respectively, memory cell 1100 becomes accessible via bitlines 1210 and 1220.

Continuing with memory circuit 1000, chargeline 1400 is configured to permit bitlines 1210 and 1220 to be precharged via transistors 1410 and 1420, respectively, to enable certain operations of memory circuit 1000. As will be described further below, bitlines 1210 and 1220 may be precharged in some embodiments prior to performing a reading or sensing operation of the logic state of memory cell 1100. In the present embodiment, chargeline 1400 couples to transistors 1410 and 1420 via control terminals 1413 and 1423, respectively. Bitline 1210 couples to terminal 1412 of transistor 1410, while bitline 1220 couples to terminal 1422 of transistor 1420 in the present embodiment. Memory circuit 1000 also comprises power node 1510 coupled to terminals 1411 and 1421, respectively, of transistors 1410 and 1420.

In the present embodiment, power node 1510 comprises a powersource path to a precharge voltage for memory cell 1100. In the same or a different embodiment, the powersource path can lead to a memory circuit power source for memory circuit 1000, where the memory circuit power source can provide a memory circuit power voltage for memory circuit 1000. The precharge voltage can be similar to and/or derived from the memory circuit power voltage in some examples. In the same or a different embodiment, the memory circuit power voltage could be referred to as Vdd. When chargeline 1400 actuates control terminals 1413 and 1423 of transistors 1410 and 1420, respectively, bitlines 1210 and 1220 are coupled to the powersource path of power node 1510 and are thereby precharged to the precharge voltage value and/or to a logic-high.

In some examples, the precharge voltage and/or the memory circuit power voltage can be approximately 5 volts to approximately 30 volts. In other examples, the memory circuit power voltage can be approximately 5 volts to approximately 30 volts, with the precharge voltage being arbitrary and/or different than the memory circuit power voltage, but still high enough to be distinguishable from a voltage at a discharge path such as the ground path of power nodes 1520 and/or 1540 (described below).

The write voltage can also be arbitrary and/or based on the write time. The rate of threshold voltage degradation and/or increase can be proportional to the write voltage, such that larger write voltages can result in shorter write times. Being the largest readily available voltage, the memory circuit power voltage can be used for the write voltage, for example, to expedite write times. Of course, any voltage larger than the breakdown voltage would cause permanent damage if applied to a device such as transistor 1110 or 1120.

In a different embodiment comprising a different logic design, power node 1510 could be coupled to a ground path instead. As a result, transistors 1410 and 1420 would couple bitlines 1210 and 1220 to the ground path of power node 1510 when enabled by chargeline 1400, thereby precharging bitlines 1210 and 1220 to ground voltage and/or to a logic-low.

As illustrated in FIG. 1, transistors 1110, 1120, 1131, 1132, 1410, and 1420 comprise NMOS transistors. In addition, at least transistors 1110 and 1120 comprise thin film transistors, although one or more of transistors 1131, 1132, 1410, and 1420 could also comprise thin film transistors in some embodiments. Transistors 1110 and 1120 of memory cell 1100 are further coupled to power node 1520 via terminals 1112 and 1122, respectively, where power node 1520 couples to the ground path in the present embodiment. As mentioned above, power node 1510 is coupled to the powersource path leading to the precharge voltage. When accessed via access mechanism 1130, memory cell 1100 can "pull down" the precharge voltage of at least one of bitlines 1210 and 1220 to the ground path of power node 1520.

Continuing FIG. 1, memory circuit 1000 further comprises readline 1600 coupled to control terminals 1613 and 1623 of transistors 1610 and 1620, respectively. Transistor 1610 comprises terminal 1611 coupled to bitline 1210, and terminal 1612 coupled to bitpath 1650. Similarly, transistor 1620 comprises terminal 1621 coupled to bitline 1220, and terminal 1622 coupled to bitpath 1660. Readline 1600 can be configured to actuate control terminals 1613 and 1623 of transistors 1610 and 1620, respectively, to couple bitpaths 1650 and 1660 to bitlines 1210 and 1220, respectively. Such a configuration can be used, for example, to access and sense the logic state of memory cell 1100 via bitpaths 1650 and/or 1660.

Memory circuit 1000 also comprises writeline 1700 in the present embodiment. Writeline 1700 is coupled to control terminals 1713 and 1723 of transistors 1710 and 1720, respectively. Transistor 1710 comprises terminal 1711 coupled to bitline 1210, and terminal 1712 coupled to datapath 1750. Similarly, transistor 1720 comprises terminal 1721 coupled to bitline 1220, and terminal 1722 coupled to datapath 1760. Readline 1700 can be configured to actuate control terminals 1713 and 1723 of transistors 1710 and 1720, respectively, to couple datapaths 1750 and 1760 to bitlines 1210 and 1220, respectively. Datapath 1750 can be used in some examples to route the write voltage to control terminal 1123 of transistor 1120, while datapath 1760 can be similarly used to route the write voltage to control terminal 1113 of transistor 1110. Such a configuration can be used, for example, to access memory cell 1110 via datapaths 1750 and/or 1760 and thereby write and/or toggle the logic state of memory cell 1100.

In the present example of FIG. 1, memory circuit comprises read assist mechanism 1800 configured to couple to memory cell 1100 via bitlines 1210 and 1220. Read assist mechanism 1800 comprises transistors 1810 and 1820 cross-coupled together, such that control terminal 1813 of transistor 1810 is coupled to terminal 1822 of transistor 1820, and control terminal 1823 of transistor 1820 is coupled to terminal 1812 of transistor 1810 in the embodiment of FIG. 1. Terminals 1811 and 1821 of transistors 1810 and 1820, respectively, are coupled to power node 1530. Power node 1530 is shown in FIG. 1 coupled to the powersource path, which is similar in the present embodiment to the powersource path of power node 1510.

Transistor 1810 of read assist mechanism 1800 is configured to couple to bitline 1210 via terminal 1812, while transistor 1820 is configured to couple to bitline 1220 via terminal 1822. In the present example, however, access to bitlines 1210 and 1220 for read assist mechanism 1800 is controlled by transistors 1830 and 1840, where transistor 1830 is coupled between bitline 1210 and terminal 1812 of transistor 1810, and transistor 1840 is coupled between bitline 1220 and terminal 1822 of transistor 1820. As a result, when enabled, transistors 1830 and 1840 couple read assist mechanism 1800 to bitlines 1210 and 1220. In the present example, transistors 1830 and 1840 can be enabled based on a reset signal 1990 at control terminals 1833 and 1843 of transistors 1830 and 1840, respectively.

In the embodiment of FIG. 1, transistors 1110 and 1120 of memory cell 1100 are shown as NMOS transistors, while transistors 1810 and 1820 of read assist mechanism 1800 are shown as PMOS transistors. As a result, memory circuit 1000 comprises Complementary Metal-Oxide Semiconductor (CMOS) circuitry. In another embodiment, a memory circuit similar to memory circuit 1000 can also comprise CMOS circuitry by implementing transistors 1110 and 1120 of memory cell 1100 as PMOS transistors, and transistors 1810 and 1820 as NMOS transistors. Such another embodiment could also comprise alternate connections to powersource paths or ground paths for power nodes 1510, 1520, and/or 1530.

During a read operation of memory cell 1100 in FIG. 1, read assist mechanism 1800 can be configured to maintain one of bitlines 1210 or 1220 at or near the voltage of power node 1530. In the present example, the voltage of power node 1530 is similar to the precharge voltage sourced from power node 1510. When transistors 1830 and 1840 of read assist mechanism 1800 are enabled along with transistors 1131 and 1132 of the access mechanism of memory cell 1100, control terminal 1823 of transistor 1820 of read assist mechanism 1800 can couple through bitline 1210 to terminal 1111 of transistor 1110 of memory cell 1100. Similarly, control terminal 1813 of transistor 1810 of read assist mechanism 1800 can couple through bitline 1220 to terminal 1121 of transistor 1120 of memory cell 1100. As a result, during the read operation, while transistor 1110 of memory cell 1100 substantially discharges bitline 1210, terminal 1823 activates transistor 1820 of read assist mechanism 1800 to couple bitline 1220 to power node 1530, thereby maintaining bitline 1220 at or near the voltage of power node 1530. Conversely, while transistor 1120 of memory cell 1100 substantially discharges bitline 1220, terminal 1813 activates transistor 1810 of read assist mechanism 1800 to couple bitline 1210 to power node 1530, thereby maintaining bitline 1210 at or near the voltage of power node 1530.

Although memory circuit 1000 is shown comprising read assist mechanism 1800, there can be other embodiments that could still read memory cell 1100 even if devoid of read assist mechanism 1800. Such embodiments could be configured to sense the logic state of memory cell 1100 before the precharge voltage at bitline 1210 or 1220 is adversely affected by factors such as leakage.

In the present embodiment, memory circuit 1000 also comprises a memory reset mechanism 1900 comprising reset transistor 1910 coupled between bitline 1210 and power node 1540, and reset transistor 1920 coupled between bitline 1220 and power node 1540. Power node 1540 is similar to power node 1520 in the present example, being coupled to the ground path. Reset mechanism 1900 can be enabled when reset line 1990 actuates control terminals 1913 and 1923 of reset transistors 1910 and 1920, respectively. In a different embodiment, a memory reset mechanism similar to reset mechanism 1900 could comprise a single reset transistor coupled between power node 1540 and both of bitlines 1210 and 1220.

Reset mechanism 1900 can be configured in the present example to route a charge at control terminal 1113 of transistor 1110 of memory cell 1100 to the ground path of power node 1540, and/or to route a charge at control terminal 1123 of transistor 1120 of memory cell 1100 to the ground path of power node 1540. These charges may be, for example, remnants of the precharge voltage established during a read operation. The ability to thereby reset memory cell 1100 can be useful, for example, to restrict such charges from further degrading the threshold voltages of transistors 1110 and/or 1120 of memory cell 1100. Other embodiments, however, need not comprise reset mechanism 1900.

In some examples, transistors 1110 and/or 1120 can be configured to withstand at least approximately 2000 read cycles of memory cell 1100. In these examples, at least one of transistors 1110 and/or 1120 can be exposed to the precharge voltage at each read cycle before the difference between the threshold voltages of transistors 1110 and 1120 is sufficiently altered, due to exposure to the precharge voltage, to risk toggling the logic state of memory cell 1100. In the same or different embodiments, the precharge voltage can be referred to as a read voltage.

Figure 2:
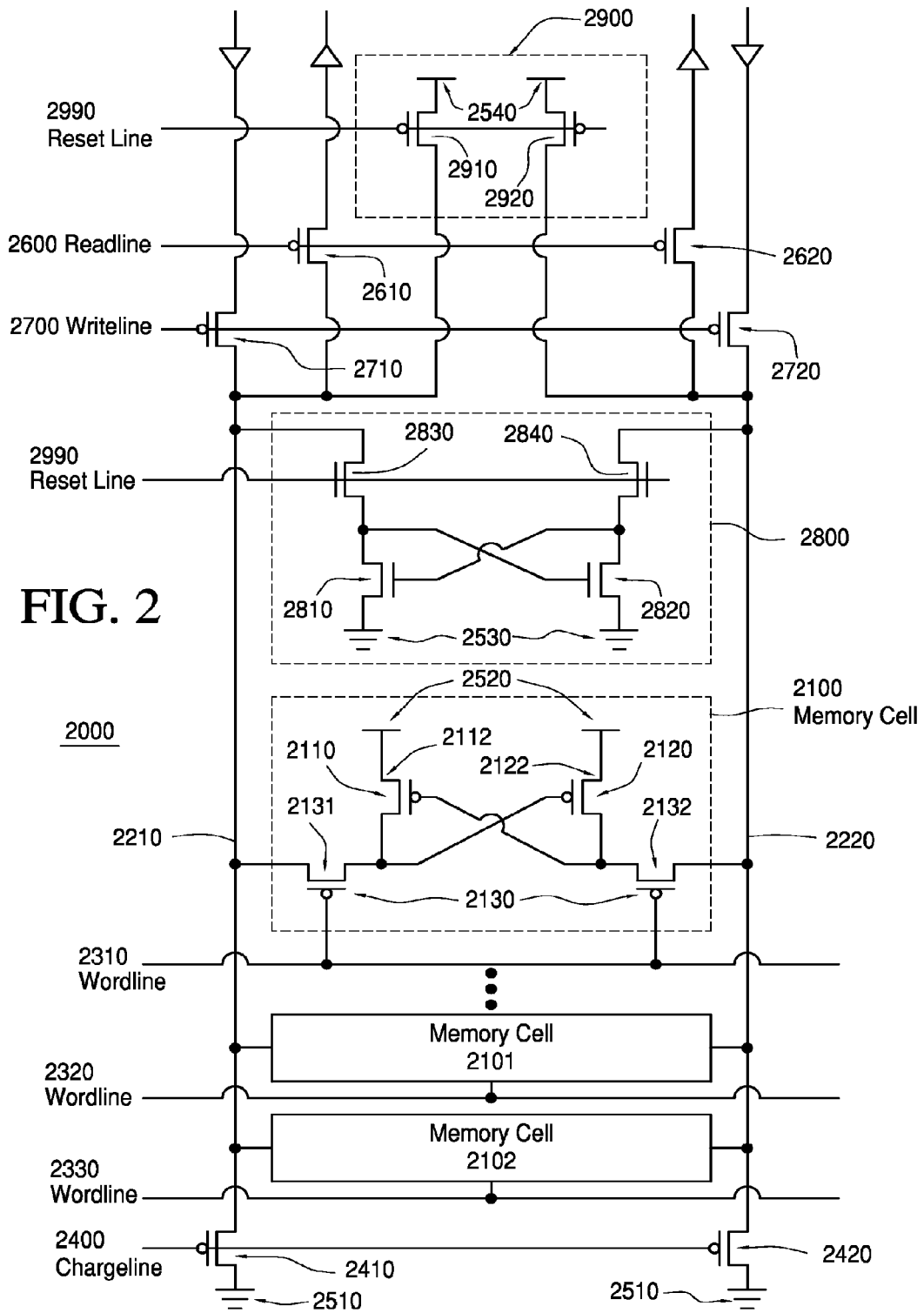
FIG. 2 illustrates a schematic of a second memory circuit in accordance with a second embodiment of the present disclosure.

Moving along, FIG. 2, illustrates a schematic of a memory circuit 2000, similar to memory circuit 1000 of FIG. 1 but in accordance with another embodiment of the present disclosure. Memory circuit 2000 comprises memory cell 2100, similar to memory cell 1100 of memory circuit 1000 (FIG. 1), but comprising PMOS transistors 2110 and 2120 instead of transistors 1110 and 1120 (FIG. 1). As shown in FIG. 2, transistors 2131, 2132, 2410, and 2420 of memory circuit 2000 also comprise PMOS transistors in the present embodiment. In addition, at least transistors 2110 and 2120 comprise thin film transistors, although one or more of transistors 2131, 2132, 2410, and 2420 could also comprise thin film transistors in some embodiments.

Transistors 2110 and 2120 of memory cell 2100 are further coupled to power node 2520 via terminals 2112 and 2122, respectively, where power node 2520 couples to a powersource path in the present embodiment. This contrasts with power node 1520 in FIG. 1, which is coupled to a ground path. In the same or a different embodiment, the powersource path for power node 2520 can lead to a memory circuit power source providing a memory circuit power voltage for memory circuit 2000. In the same or a different example, the memory circuit power voltage can be approximately 5 volts to approximately 30 volts.

Memory circuit 2000 also comprises chargeline 2400, similar to chargeline 1400 of memory circuit 1000 (FIG. 1), but is coupled to control terminals of transistors 2410 and 2420. Chargeline 2400 can be used to enable transistors 2140 and 2420 to couple bitlines 2210 and 2220, respectively, to power node 2510. The arrangement in memory circuit 2000 for chargeline 2400, transistors 2410 and 2420, and power node 2510 is similar to that for chargeline 1400, transistors 1410 and 1420, and power node 1510 of memory circuit 1000 (FIG. 1). Power node 2510, however, is coupled to the ground path in the present embodiment. Chargeline 2400 can thus be configured to permit bitlines 2210 and 2220 to be predischarged via transistors 2410 and 2420, respectively.

Memory cell 2100 is accessible in memory circuit 2000 when wordline 2310 activates access mechanism 2130, similar to the arrangement in memory circuit 1000 for wordline 1310 and access mechanism 1130 (FIG. 1). Memory circuit 2000 also comprises other memory cells, such as memory cells 2101 and 2102, which can be made accessible via respective wordlines such as wordlines 2320 and 2330. As mentioned above, power node 2510 is coupled to the ground path leading to the predischarge voltage for memory circuit 2000. When made accessible by access mechanism 2130, memory cell 2100 can "pull up" the precharge voltage of at least one of bitlines 2210 and 2220 to the powersource path of power node 2520. Similar to memory circuit 1000 in FIG. 1, memory circuit 2000 in FIG. 2 can have numerous columns and rows of memory cells.

Memory circuit 2000 also comprises read assist mechanism 2800 with transistors 2810, 2820, 2830, and 2840, similar to read assist mechanism 1800 with transistors 1810, 1820, 1830, and 1840 in memory circuit 1000 (FIG. 1). Transistors 2810, 2820, 2830, and 2840, however, comprise NMOS transistors for memory circuit 2000. As a result, memory circuit 2000 comprises CMOS circuitry. In addition, read assist mechanism 2800 couples to the ground path of power node 2530, rather than to the powersource path of power node 1530 of read assist mechanism 1800 (FIG. 1). In the same or a different embodiment, power node 2530 can be similar to power node 2510. In some embodiments, memory circuit 2000 need not comprise reset mechanism 2800, and/or could comprise only PMOS circuitry. In addition, as shown in FIG. 2, memory circuit 2000 can comprise reset mechanism 2900, which can be enabled through reset line 2990 in the present example. Reset mechanism 2900 can be similar to reset mechanism 1990 of memory circuit 1000 (FIG. 1), but in the present embodiment, reset mechanism 2900 comprises PMOS transistors 2910 and 2920 coupled to a power node 2540. Power node 2540 can be similar to power node 2520 in the present or other embodiments. Other embodiments could comprise memory circuit 2000 without reset mechanism 2990.

FIG. 2 also shows memory circuit 2000 also comprising writeline 2700 configured to enable transistors 2710 and 2720 to couple datapaths to bitlines 2210 and 2220, respectively, similar to the arrangement of memory circuit 1000 for writeline 1700 with respect to transistors 1710 and 1720 and datapaths 1750 and 1760. In addition, memory circuit comprises readline 2600 configured to enable transistors 2610 and 2620 to couple bitpaths to bitlines 2210 and 2220, respectively, similar to the arrangement of memory circuit 1000 for readline 1600 with respect to transistors 1610 and 1620 and bitpaths 1650 and 1660.

Figure 3:
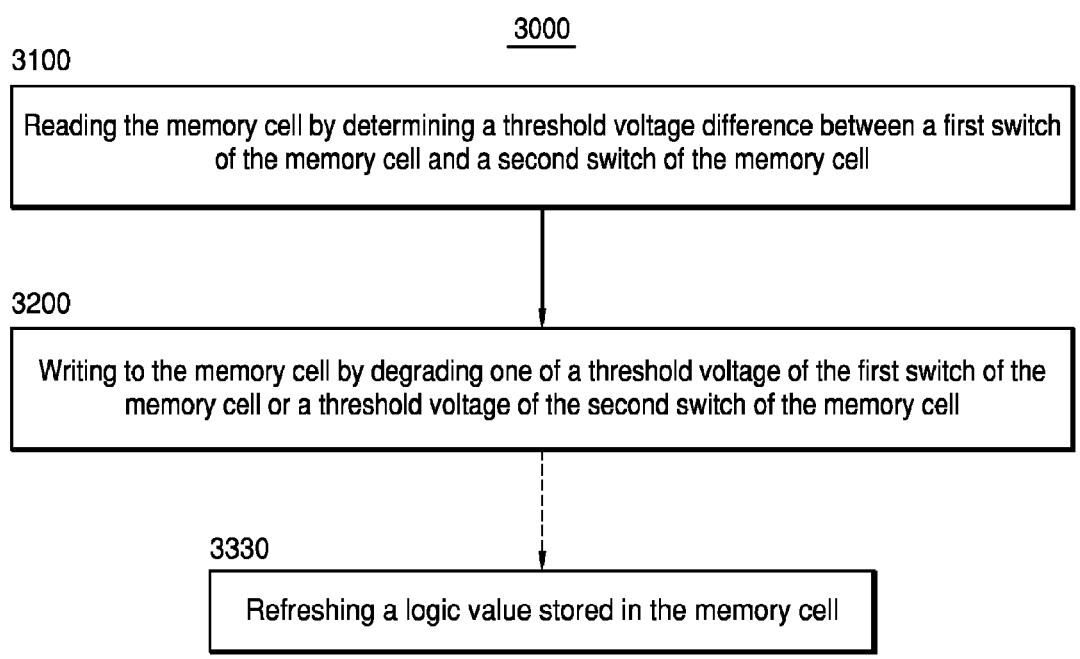
FIG. 3 illustrates a flowchart of a method for operating a memory cell of one of the memory circuits of the present disclosure.

Forging ahead, FIG. 3 illustrates a flowchart of a method 3000 for operating a memory cell. In some embodiments, the memory cell of method 3000 can be similar to memory cell 1100 of memory circuit 1000 (FIG. 1), and/or to memory cell 2100 of memory circuit 2000 (FIG. 2).

Block 3100 of method 3000 comprises reading the memory cell by determining a threshold voltage difference between a first transistor of the memory cell and a second transistor of the memory cell. In some examples, the first transistor of the memory cell of method 3000 can be similar to transistor 1110 of memory cell 1100 in memory circuit 1000 (FIG. 1), and/or similar to transistor 2110 of memory cell 2100 in memory circuit 2000 (FIG. 2). Similarly, the second transistor of the memory cell of method 3000 can be similar to transistor 1120 of memory cell 1100 in memory circuit 1000 (FIG. 1), and/or similar to transistor 2120 of memory cell 2100 in memory circuit 2000 (FIG. 2). The first and second transistors of the memory cell of method 3000 can be cross-coupled, for example, as illustrated for transistors 1110 and 1120 (FIG. 1), or for transistors 2110 and 2120 of memory cell 2100 (FIG. 2).

The threshold voltage difference between the first and second transistors of the memory cell of method 3000 can be used to read, sense, and/or determine a logic state of the memory cell. For example, if the threshold voltage of the first transistor of the memory cell of method 3000 is greater than the threshold voltage of the second transistor of the memory cell of method 3000, then the logic state of the memory cell of method 3000 could be considered to be in an asserted state similar to the asserted state described above for memory cell 1100 (FIG. 1). Conversely, if the threshold voltage of the second transistor of the memory cell of method 3000 is greater than the threshold voltage of the first transistor of the memory cell of method 3000, then the logic state of the memory cell of method 3000 could be considered to be in a de-asserted state similar to the de-asserted state described above for memory cell 1100 (FIG. 1).

The memory cell of method 3000 can be made accessible via an access mechanism coupled to a wordline. The access mechanism can be configured to couple the first transistor of the memory cell of method 3000 to a first bitline, and to couple the second transistor of the memory cell of method 3000 to a second bitline. In some examples, the access mechanism can be similar to access mechanism 1130 described above for memory cell 1100 (FIG. 1). Similarly, the first and second bitlines can be part of a memory circuit that comprises the memory cell of method 3000, similar to bitlines 1210 and 1220 of memory circuit 1000 in FIG. 1.

Figure 4:
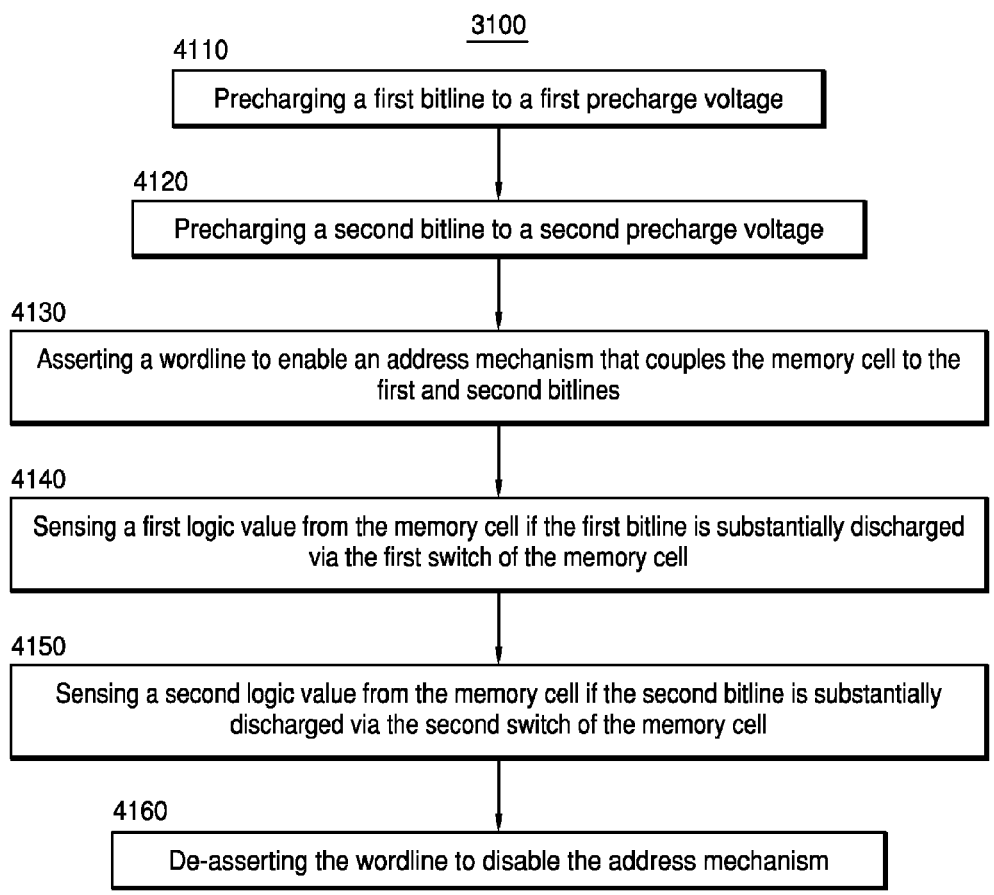
FIG. 4 illustrates a flowchart for reading the memory cell of the method of FIG. 3.
Figure 5:
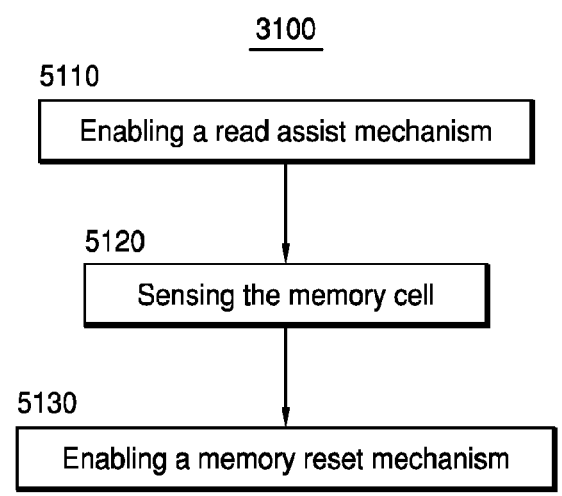
FIG. 5 illustrates a flowchart for two optional operations related to reading the memory cell of the method of FIG. 3
Figure 8:
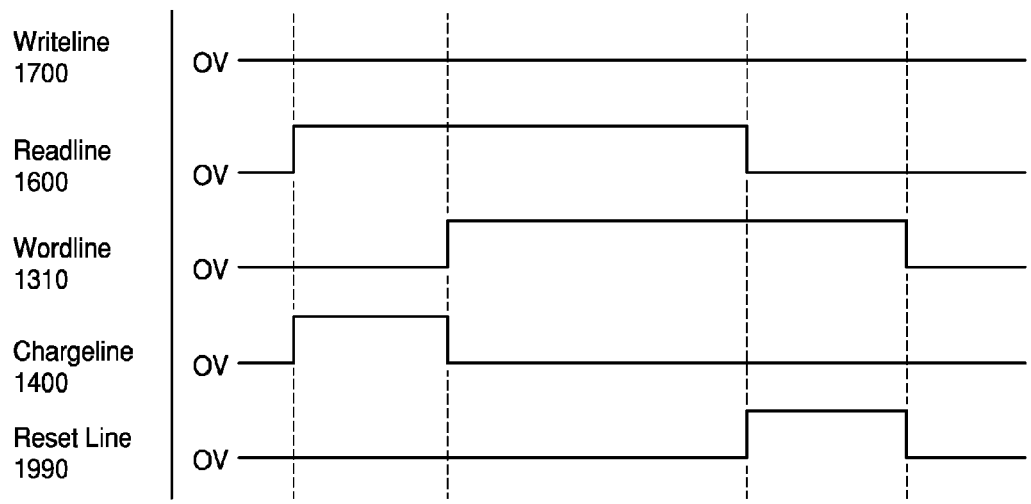
FIG. 8 illustrates a timing diagram for a read operation on the memory cell of the method of FIG. 3.

In some examples, block 3100 of method 3000 can comprise several sub-parts, and could be executed in some examples as described in FIG. 4, FIG. 5, and/or FIG. 8. FIG. 4 illustrates a flowchart of block 3100 for reading the memory cell of method 3000. FIG. 5 illustrates a flow chart of block 3100 for two optional operations related to reading the memory cell of method 3000. FIG. 8 illustrates a timing diagram for a read operation on the memory cell of method 3000. FIGS. 5 and 8 are explained in more detail below.

Returning to FIG. 4, block 4110 of block 3100 of method 3000 comprises precharging a first bitline to a first precharge voltage. In one embodiment, the first bitline can be similar to bitline 1210 of memory circuit 1000 (FIG. 1). In such an embodiment, the precharge voltage can be routed between power node 1510 and bitline 1210 via transistor 1410 when chargeline 1400 enables control terminal 1413 of transistor 1410.

Block 4120 of block 3100 of method 3000 is similar to block 4110, and comprises precharging a second bitline to a second precharge voltage. In one embodiment, the second bitline can be similar to bitline 1220 of memory circuit 1000 (FIG. 1). In such an embodiment, the precharge voltage can be routed between power node 1510 and bitline 1220 via transistor 1420 when chargeline 1400 enables control terminal 1423 of transistor 1420. The first and second precharge voltages of blocks 4110 and 4120 could be similar or identical in some examples, and blocks 4110 and 4120 could be performed simultaneously. Once precharged, the first and second bitlines can be decoupled from the source of the first and second precharge voltage by de-asserting the chargeline.

Block 4130 of block 3100 of method 3000 comprises asserting a wordline to enable an access mechanism that couples the memory cell to the first and second bitlines. In some examples, the wordline can be similar to wordline 1310 controlling access mechanism 1130 for memory cell 1100 in FIG. 1. When asserted, the wordline enables the access mechanism to couple the first bitline to both a first terminal of the first transistor of the memory cell, and to a control terminal of the second transistor of the memory cell. The wordline also enables the access mechanism to couple the second bitline to both a first terminal of the second transistor of the memory cell, and to a control terminal of the first transistor of the memory cell. In the example of FIG. 1, the first transistor of could correspond to transistor 1110 and the second transistor could correspond to transistor 1120, with corresponding terminals as described above for FIG. 1. Block 4120 can be completed before performing block 4130, or block 4120 can be completed while or after starting block 4130.

Block 4140 of block 3100 of method 3000 comprises sensing a first logic value from the memory cell if the first bitline is substantially discharged via the first transistor of the memory cell. In some examples, sensing the first logic value can comprise substantially discharging the first bitline via the first terminal of the first transistor, and disabling the second transistor to restrict discharge of the second bitline when the control terminal of the second transistor is turned off by the discharge of the first bitline. The substantial discharge of the first bitline can then be sensed to identify the first logic value. In the same or a different example, the first logic value can be sensed even if the second bitline is partially discharged via the second transistor before the second transistor was turned off. In some embodiments, the first logic value can correspond to a de-asserted state of the memory cell. Block 4140 can be performed while the wordline remains asserted in block 4130.

Block 4150 of block 3100 of method 3000 comprises sensing a second logic value from the memory cell if the second bitline is substantially discharged via the second transistor of the memory cell. In some examples, sensing the second logic value can comprise substantially discharging the second bitline via the first terminal of the second transistor, and disabling the first transistor to restrict discharge of the first bitline when the control terminal of the first transistor is turned off by the discharge of the second bitline. The substantial discharge of the second bitline can be sensed to identify the second logic value. In the same or a different example, the second logic value can be sensed even if the first bitline is partially discharged via the first transistor before the first transistor was turned off. In some embodiments, the second logic value can correspond to an asserted state of the memory cell. Block 4150 can be performed while the wordline remains asserted in block 4130, and the sequence of blocks 4140 and 4150 can be reversed or performed simultaneously.

As an example, blocks 4140 and 4150 can be implemented in the example of FIG. 1 as follows. After chargeline 1400 is de-asserted to decouple bitlines 1210 and 1220 from power node 1510, and after memory cell 1100 is coupled to bitlines 1210 and 1220 by the assertion of wordline 1300, the first precharge voltage in bitline 1210 will start discharging via transistor 1110 of memory cell 1100, while the second precharge voltage in bitline 1220 will start discharging via transistor 1120 of memory cell 1100. Block 4140 will be executed if the threshold voltage of transistor 1120 is greater than the threshold voltage of transistor 1110. During block 4140, bitline 1210 will discharge faster than bitline 1220, thereby disabling control terminal 1123 of transistor 1120, and thus restricting bitline 1220 from further substantially discharging via transistor 1120. On the other hand, block 4150 will be executed if the threshold voltage of transistor 1110 is greater than the threshold voltage of the transistor 1120. During block 4150, bitline 1220 will discharge faster than bitline 1210, thereby disabling control terminal 1113 of transistor 1110, and thus restricting bitline 1210 from substantially discharging via transistor 1110.

Block 4160 of block 3100 of method 3000 comprises de-asserting the wordline to disable the access mechanism of block 4130. This de-assertion can be done after block 4140 or 4150 have been executed, when access to the memory cell is no longer necessary. In the example of FIG. 1, block 4160 can be carried out by de-asserting wordline 1310 to disable access mechanism 1130, thereby decoupling memory cell 1100 from bitlines 1210 and 1220. Blocks 4110, 4120, 4130, 4140, 4150, and 4160 also can be performed for other memory cells in memory circuit 1000 in FIG. 1 and/or memory circuit 2000 in FIG. 2.

In the same or a different example, block 3100 of method 3000 can comprise other subparts as illustrated in FIG. 5. FIG. 5 illustrates a flowchart for optional operations related to the reading of the memory cell of block 3100. If the flow chart in FIG. 5 is performed, block 5110 can be performed with or without block 5130, and vice versa, as explained below.

Block 5110 of block 3100 of method 3000 comprises enabling a read assist mechanism for the reading of the memory cell of method 300. In some embodiments, the read assist mechanism can be similar to read assist mechanism 1800 described above for memory circuit 1000 in FIG. 1. In the same or a different embodiment, the read assist mechanism of block 5110 can be enabled prior to the reading of the memory cell described above in FIG. 4 for blocks 4110, 4120, 4130, 4140, 4150, and 4160.

Block 5110 can comprise coupling a first transistor of the read assist mechanism to a first bitline, and coupling a second transistor of the read assist mechanism to a second bitline, where the first and second bitlines can be as described above for blocks 4110 and 4120. The first and second transistors of the read assist mechanism can couple the first and second bitlines, respectively, to a read-assist voltage. In some examples, the read assist voltage can be similar or identical to the precharge voltages described above for blocks 4110 and/or 4120 (FIG. 4). In the example of FIG. 1, the first transistor of the read assist mechanism in block 5110 can be similar to transistor 1810 of read-assist mechanism 1800, configured to couple bitline 1210 to the read assist voltage at power node 1530 when reset line 1990 enables transistor 1830. Similarly, the second transistor of the read assist mechanism in block 5110 can be similar to transistor 1820 of read-assist mechanism 1800, configured to couple bitline 1220 to the read assist voltage at power node 1530 when reset line 1990 enables transistor 1840.

During the reading of the memory cell in block 3100, if the first bitline is substantially discharged via the first transistor of the memory cell, as described above for block 4140 (FIG. 4), the second transistor of the read assist mechanism can be enabled due to the effect that the discharge of the first bitline has upon the control terminal of the second transistor of the read assist mechanism. When so enabled, the second transistor of the read assist mechanism can charge or maintain the second bitline proximate to the read assist voltage and thereby prevent the second bitline from partially discharging while the first bitline is substantially discharged. The second precharge voltage can be similar or identical to the first precharge voltage of block 4110 (FIG. 4).

Similarly, during the reading of the memory cell in block 3100, if the second bitline is substantially discharged via the second transistor of the memory cell, as described in block 4150 (FIG. 4), the first transistor of the read assist mechanism can be enabled due to the effect that the discharge of the second bitline has upon the control terminal of the first transistor of the read assist mechanism. When so enabled, the first transistor of the read assist mechanism can charge or maintain the first bitline proximate to the read assist voltage and thereby prevent the first bitline from partially discharging while the second bitline is substantially discharged.

Block 5120 of block 3100 of method 3000 in FIG. 5 comprises sensing the memory cell of method 3000. In some embodiments, the sensing of the memory cell in block 5120 can be carried out as described above in FIG. 4 for blocks 4110, 4120, 4130, 4140, 4150, and 4160 of method 3000.

Block 5130 of block 3100 of method 3000 in FIG. 5 comprises enabling a memory reset mechanism. In some embodiments, the memory reset mechanism of block 5130 can be enabled after the reading of the memory cell described above in FIG. 4 for blocks 4110, 4120, 4130, 4140, 4150, and 4160.

The memory reset mechanism of block 5130 can be used to restrict a degradation of the threshold voltage of one or more of the first or second transistors of the memory cell of method 3000 by discharging unwanted charges at the control terminals of the first and/or second transistors of the memory cell. In some examples, the unwanted charges may be leftover from prior operations such as from the sensing of the memory cell in block 5130 (FIG. 5), or the writing to the memory cell in block 3200 (FIG. 3). As seen in the timing diagram of FIG. 8, the reset line can be asserted to discharge any remaining unwanted charges in the memory cell upon completion of a read cycle when the read line is de-asserted. In some embodiments, the read assist mechanism of block 5110 can be in the disabled state when the memory reset mechanism of block 5130 is in the enabled state.

In some embodiments, the memory reset mechanism of block 5130 can be similar to memory reset mechanism 1900 described above for memory circuit 1000 in FIG. 1. In the example of FIG. 1, memory reset mechanism 1900 can be enabled by coupling memory cell 1100 to bitlines 1210 and 1220 via access mechanism 1130, and by enabling transistors 1910 and 1920 of reset mechanism 1900 via reset line 1990. When so enabled, control terminal 1123 of transistor 1120 of memory cell 1100 couples to power node 1450 via bitline 1210 and transistor 1910 of reset mechanism 1900. Similarly, control terminal 1113 of transistor 1110 of memory cell 1100 couples to power node 1450 via bitline 1220 and transistor 1920 of reset mechanism 1900. In the example of FIG. 1, because power node 1540 is coupled to a ground path, any unwanted charge at memory cell 1100 would be sourced to ground, thereby restricting further degradation of the threshold voltages of transistors 1110 and 1120 of memory cell 1100.

Returning to FIG. 3, and continuing with method 3000, block 3200 comprises writing to the memory cell by degrading one of a threshold voltage of the first transistor of the memory cell or a threshold voltage of the second transistor of the memory cell. Such degradation can be used to toggle the logic state of the memory cell of method 3000 from the asserted state to the de-asserted state, or vice versa.

In the present example, the first and second transistors of the memory cell of method 3000 comprise thin film transistors subject to electrical stress degradation of their respective conducting channels, as described above for transistors 1110 and 1120 of memory cell 1100 (FIG. 1). Such electrical stress degradation characteristics can be advantageously used and controlled when writing to the memory cell to degrade the threshold voltage of the first transistor of the memory cell relative to the second transistor of the memory cell, and/or vice versa. As an example, writing to the memory cell of method 3000 can comprise applying a write voltage to a control or gate terminal of a target transistor, where the target transistor can be selected to be one of the first or second transistors of the memory cell of method 3000. In some examples, the target transistor can be selected based on a desired logic state for the memory cell.

In some embodiments, the write voltage can be applied to the control terminal of the target transistor as described above for memory circuit 1000 in FIG. 1. For example, if the target transistor were determined to be transistor 1110 of memory cell 1100, the write voltage could be applied to datapath 1760. With writeline 1700 and wordline 1310 enabled, transistor 1720 would permit the write voltage on datapath 1760 to propagate through bitline 1220, through transistor 1132 of access mechanism 1130, and to control terminal 1113 of transistor 1110 of memory cell 1100. Such a sequence would permit the write voltage to stress and/or degrade the threshold voltage of transistor 1110 until at least one of write line 1700 or wordline 1310 was disabled. A similar process can be used if the target transistor was transistor 1120 of memory cell 1000. The write voltage applied to the control terminal of the target transistor can cause a charge injection into a gate insulator of the target transistor, and/or cause a creation of defect states in a channel of the target transistor, thereby degrading the threshold voltage of the target transistor. In some examples, the write voltage can have a magnitude of approximately 5 volts to approximately 30 volts. Larger write voltages will result in shorter write times and faster circuits, but the rate of threshold voltage degradation is proportional to the magnitude of the write voltage. In many practical embodiments, the memory circuit power voltage is used for the write voltage because it is the largest readily available voltage. In many embodiments, voltages larger than the breakdown voltage of the transistor are not used as the write voltage because such large voltages can permanently damage the transistor.

In the same or a different embodiment, the first and second transistors of the memory cell of method 3000 can comprise thin film transistors with an amorphous material, such as amorphous silicon, a metal oxide material, such as zinc oxide, a mixed oxide material, such as Indium/Gallium/Zinc Oxide (IGZO), a nanocrystalline material, such as nanocrystalline silicon, and/or an organic material, such as pentacene. In other embodiments, the first and second transistors can comprise transistors with otherwise degradable threshold voltages. The memory cell of method 3000 can thus be non-volatile, such that the threshold voltages of the first and second transistors of the memory cell of method 3000 can be maintained when power is not supplied to the memory cell.

In some examples, the writing to the memory cell in block 3200 of method 3000 can comprise degrading the threshold voltage of the target transistor of the memory cell until the threshold voltage of the target transistor is degraded to be higher than a threshold voltage of a nontarget NMOS transistor of the memory cell, or degraded to be lower than a threshold voltage of a nontarget PMOS transistor of the memory cell. In such examples, the nontarget transistor can be selected based on the target transistor. If the target transistor is selected to be the first transistor of the memory cell, then the nontarget transistor would be selected to be the second transistor of the memory cell, and vice versa.

For block 3200, the degrading of the threshold voltage of the target transistor of the memory cell can be performed according to different approaches. One such approach is non-iterative, and could comprise applying the write voltage continuously to the control terminal of the target transistor at a predetermined write voltage until the threshold voltage of the target transistor was degraded further than the threshold voltage of the nontarget transistor. In the same or a different example, the write voltage could be applied to the control terminal of the target transistor for a predetermined write time calculated to ensure that, regardless of the pre-write logic state of the memory cell, the threshold voltage of the target transistor would be further degraded than that of the nontarget transistor upon removal of the write voltage. In one example, the write time can be approximately 300 seconds with a write voltage of 30V. The threshold voltage degradation or shift is approximately proportional to time to the 0.3 power. Therefore, the write time can be traded off with the write voltage. For example, a longer write time can be used with a lower write voltage, and vice versa.

Another approach to the degrading of the threshold voltage of the target transistor can comprise the application of an iterative write mechanism. The iterative writing mechanism can comprise: (a) routing the write voltage to the control terminal of the target transistor, and (b) comparing the threshold voltages of the target and nontarget transistors. As an example, the write voltage can be applied to the control terminal of the target transistor for a write time less than the write time described above for the non-iterative approach. In some embodiments, the comparing of the threshold voltages of the target and nontarget transistors can be carried out, as part of the iterative write mechanism, prior to the routing of the write voltage to the control terminal of the target transistor. In some embodiments, the comparing of the threshold voltages of the target and nontarget transistors, as part of the iterative writing mechanism of block 3200, can be similar to the reading of the memory cell in block 3100 of method 3000.

The iterative write mechanism can be repeated until the threshold voltage of the target transistor is degraded further than the threshold voltage of the nontarget transistor. In some embodiments, the iterative writing mechanism can also be repeated for a predetermined number of extra repetitions after the threshold voltage of the target transistor is determined to be degraded further than the threshold voltage of the nontarget transistor. Such extra repetitions can ensure, for example, that the difference between the threshold voltages of the first and second transistors of the memory cell of method 3000 is sufficient to permit the logic state of the memory cell to be accurately sensed during the numerous readings of the memory cell in block 3100 of method 3000.

Figure 6:
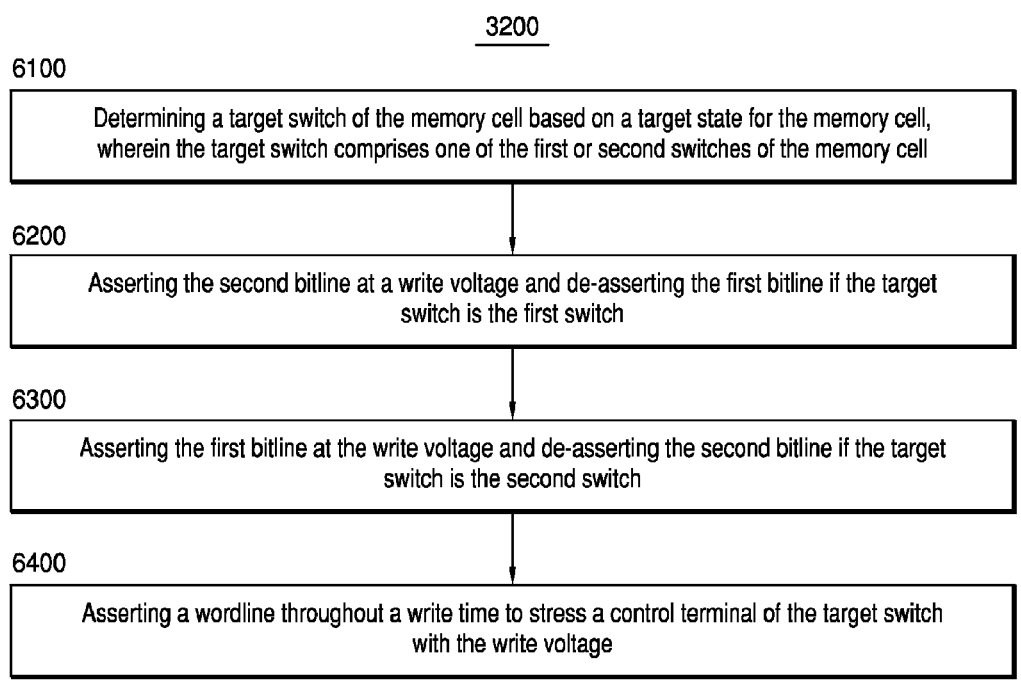
FIG. 6 illustrates a flowchart for writing to the memory cell of the method of FIG. 3.
Figure 9:
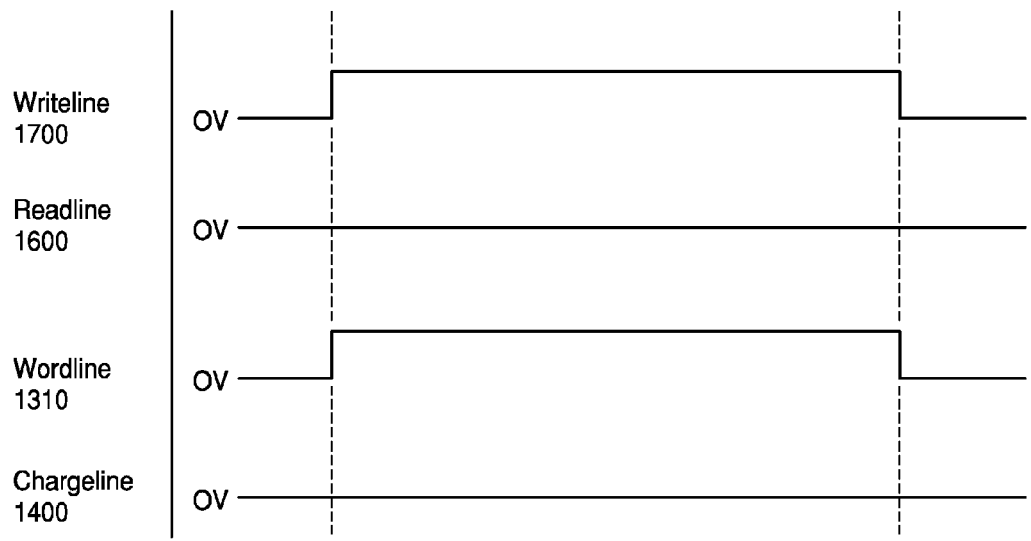
FIG. 9 illustrates a timing diagram for a write operation on the memory cell of the method of FIG. 3.

In some examples, block 3200 of method 3000 as described above can comprise several sub-parts, and could be executed in some examples in accordance with FIG. 6 and/or FIG. 9. FIG. 6 illustrates a flowchart of a method for block 3200 for writing to the memory cell of method 3000. FIG. 9 illustrates a timing diagram for a write operation on the memory cell of method 3000.

Block 6100 of block 3200 of method 3000 comprises determining a target transistor of the memory cell based on a target state for the memory cell, wherein the target transistor comprises one of the first or second transistors of the memory cell.

In some examples, block 6100 can be non-iterative as described above. In such cases, determining the target transistor in block 6100 can be done based on an initial logic state or a desired post-write logic state for the memory cell. For example, when the desired post-write logic state for the memory cell is the asserted state, then the target transistor could be determined to be the first transistor of the memory cell. Conversely, when the desired post-write logic state for the memory cell is the de-asserted state, then the target transistor could be determined to be the second transistor of the memory cell.

Figure 7:
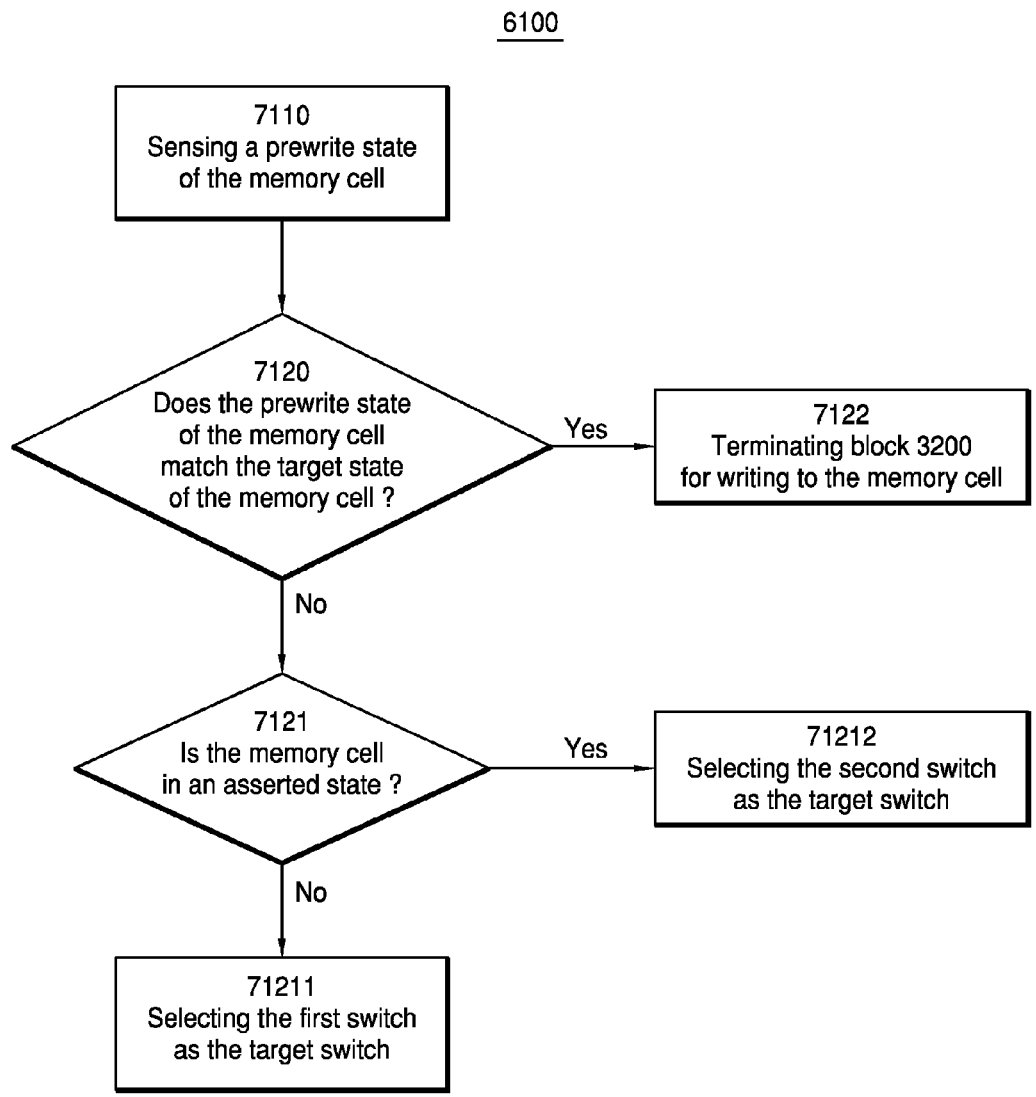
FIG. 7 illustrates a flowchart for determining a target transistor of the memory cell of the method of FIG. 3.

In other examples, block 6100 could comprise several sub-parts, regardless of whether the writing of the memory cell is iterative. In such examples, block 6100 could be implemented in accordance with FIG. 7. FIG. 7 illustrates a flowchart for a method of determining a target transistor of the memory cell of method 3000.

Block 7110 of block 6100 comprises sensing a prewrite state of the memory cell. In some examples, block 7110 can be executed as described above for the reading of the memory cell in block 3100 of method 3000. Block 7110 can be skipped if block 3100 (FIG. 3) was executed recently before block 3200 (FIG. 3). In the same or different examples, the prewrite state could be determined to be one of the asserted or de-asserted states described above.

After the prewrite state of the memory cell has been determined in block 7110, a decision must be made in block 7120. If the prewrite state of the memory cell does not match the target state of the memory cell, method 3000 proceeds in FIG. 7 to block 7121 of block 6100.

Block 7121 of block 6100 comprises determining whether the prewrite state of the memory cell is in the asserted state, based on the result of block 7110. If the prewrite state of the memory cell is the asserted state, method 3000 proceeds in FIG. 7 to block 71212 for selecting the second transistor of the memory cell of method 3000 as the target transistor to be degraded. On the other hand, if the prewrite state of the memory cell is not the asserted state, method 3000 proceeds in FIG. 7 to block 71211 for selecting the first transistor of the memory cell as the target transistor to be degraded.

Going back to block 7120, if the prewrite state of the memory cell does match the target state of the memory cell, method 3000 proceeds in FIG. 7 to block 7122. In block 7122, because the prewrite state of the memory cell already matches the target or desired state for the memory cell, block 3200 (FIG. 3) can be terminated to avoid further writing to the memory cell. This termination can be beneficial to increasing the lifetime of the memory cell by preventing unnecessary degradation of the threshold voltage of the target transistor.

In some examples, continued degradation of the threshold voltage of the target transistor can bring the threshold voltage close to the magnitude of the precharge voltages used in block 3100 for reading the memory cell. As a result, the continued degradation may make it hard or impossible for the precharge voltage to enable or turn on the first and/or second transistors of the memory cell, rendering the memory cell useless. Block 7122 can therefore be used to prevent unnecessary degrading of the memory cell, thereby increasing its longevity.

Returning to FIG. 6, block 6200 of block 3200 of method 3000 can be executed after block 6100, if the target transistor was determined in block 6100 to be the first transistor, by asserting the second bitline at a write voltage and by de-asserting the first bitline. In the example of FIG. 1, bitline 1220 can be asserted with a write voltage through datapath 1760 when writeline 1700 enables transistor 1720, and bitline 1210 can be de-asserted by not coupling the write voltage to datapath 1750.

Similarly, block 6300 of block 3200 of method 3000 can be executed, if the target transistor was determined in block 6100 to be the second transistor, by asserting the first bitline at a write voltage and by de-asserting the second bitline if the target transistor is the second transistor. In the example of FIG. 1, bitline 1210 can be asserted with a write voltage through datapath 1750 when writeline 1700 enables transistor 1710, and bitline 1220 can be de-asserted by not coupling the write voltage to datapath 1760.

Block 6400 of block 3200 of method 3000 comprises asserting a wordline throughout a write time to stress a control terminal of the target transistor with the write voltage. In some examples, the wordline can be similar to the wordline described above for block 4130 (FIG. 4). In the example of FIG. 1, wordline 1310 can be asserted to couple memory cell 1100 to bitlines 1210 and 1220 through access mechanism 1130. If bitline 1220 was asserted in block 6200 (FIG. 6) with the write voltage via datapath 1760, control terminal 1113 of transistor 1110 will be stressed with the write voltage. Conversely, if bitline 1210 was asserted in block 6300 with the write voltage via datapath 1750, control terminal 1123 of transistor 1120 will be stressed with the write voltage. When stressed throughout the write time with the write voltage, the threshold voltage of the target transistor will degrade as explained above for transistors 1110 and 1120 (FIG. 1). In some examples, the write time can depend on whether the writing of the memory cell in block 3200 of method 3000 is iterative or not. For example, if the writing in block 3200 is iterative, the write time in block 6400 could be less than if the writing in block 3200 were non-iterative, as explained previously for block 3200.

Returning again to FIG. 3, and continuing with method 3000, optional block 3300 can comprise refreshing a logic value stored in the memory cell of method 3000. Block 3300 can be implemented, for example, in situations where repeated readings in block 3100 of the memory cell without writing to the memory cell can cumulatively degrade the threshold voltages for the first and/or second transistors of the memory cell. In some examples, block 3300 can comprise refreshing the logic value of the memory cell after a predetermined number of read cycles and/or after sensing that the threshold voltage of the first transistor of the memory cell is within a predetermined range of the threshold voltage of the second transistor of the memory cell, or vice versa. In the same or different examples, the refreshing in block 3300 can comprise the writing to the memory cell of block 3200. Block 3300 can also be implemented as part of an error correction mechanism in some embodiments. For example, if the memory cell of method 3000 comprised a bit of a binary word that comprised one or more error correcting code bits, and if the memory cell formed part of a memory circuit that comprised an error correcting code mechanism, block 3300 could be executed when the error correcting code mechanism of the memory circuit detected an error in one or more of the error correcting code bits of the binary word.

In some examples, one or more of the different blocks shown in FIGS. 3-7 can be combined into a single step. For example, blocks 4110 and 4120 in FIG. 4 can be combined into a single block where the first and second bitlines are precharged simultaneously. In the same or a different example, the sequence of one or more of the different blocks of method 3000 can be changed. As an example, the sequence of blocks 3100 and 3200 can be reversed in some examples to write to the memory cell before reading the memory cell. In the same or a different example, method 3000 can comprise further or different steps.

Although the differential threshold voltage non-volatile memory and related methods have been described with reference to specific embodiments, various changes may be made without departing from the spirit or scope of the disclosure. For example, memory circuit 1000 (FIG. 1) could also be implemented without read assist mechanism 1800 and/or reset mechanism 1900, and still be capable of operating memory cell 1100. Additional examples of such changes have been given in the foregoing description. Accordingly, the disclosure of embodiments is intended to be illustrative of the scope of the invention and is not intended to be limiting. It is intended that the scope of this application shall be limited only to the extent required by the appended claims. The differential threshold voltage non-volatile memory and related methods discussed herein may be implemented in a variety of embodiments, and the foregoing discussion of certain of these embodiments does not necessarily represent a complete description of all possible embodiments. Rather, the detailed description of the drawings, and the drawings themselves, disclose at least one preferred embodiment, and may disclose alternative embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of operating a memory cell, the method comprising:
    reading the memory cell by determining a threshold voltage difference between:
        a first threshold voltage of a first transistor; and
        a second threshold voltage of a second transistor;
    and
    writing to the memory cell by degrading one of:
        the first threshold voltage of the first transistor; or
        the second threshold voltage of the second transistor;
    wherein:
        the memory cell comprises:
            the first transistor comprising the first threshold voltage and a first control terminal; and
            the second transistor comprising the second threshold voltage and a second control terminal;
        the first and second transistors are cross-coupled together;
        the threshold voltage difference corresponds to a logic state of the memory cell;
        the first and second transistors comprise thin film transistors; and
        the first and second threshold voltages are degradable relative to each other to alter the threshold voltage difference between the first and second threshold voltages and to alter the logic state of the memory cell.

2. The method of claim 1, wherein:
    reading the memory cell degrades at least one of the first threshold voltage of the first transistor or the second threshold voltage of the second transistor; and
    writing to the memory cell degrades one of the first threshold voltage of the first transistor or the second threshold voltage of the second transistor more than the reading of the memory cell.

3. The method of claim 1, wherein:
    the memory cell can be configured for:
        a de-asserted state comprising the second threshold voltage of the second transistor being greater than the first threshold voltage of the first transistor; and
        an asserted state comprising the first threshold voltage of the first transistor being greater than the second threshold voltage of the second transistor;
    and
    writing to the memory cell comprises toggling the memory cell from one of the asserted or de-asserted states to another one of the asserted or de-asserted states.

4. The method of claim 1, further comprising:
    refreshing the logic state stored in the memory cell.

5. The method of claim 4, wherein:
    refreshing the logic state stored in the memory cell comprises at least one of:

refreshing the logic state after a predetermined number of read cycles; or refreshing the logic state when the first threshold voltage of the first transistor approximates the second threshold voltage of the second transistor.

6. The method of claim 4, wherein:

the memory cell comprises a bit of a binary word;

the binary word comprises one or more error correcting code bits;

the memory cell is part of a memory circuit;

the memory circuit comprises an error correcting code mechanism; and refreshing the logic state stored in the memory cell comprises:

refreshing the logic state when the error correcting code mechanism of the memory circuit detects an error in the one or more error correcting code bits of the binary word.

7. The method of claim 1, wherein:

reading the memory cell comprises routing a precharge voltage to one or more control terminals of the first and second transistors, the one or more control terminals comprising at least one of the first control terminal of the first transistor or the second control terminal of the second transistor; and the precharge voltage degrades the at least one of the first threshold voltage of the first transistor or the second threshold voltage of the second transistor when exposed to the one or more control terminals.

8. The method of claim 1, wherein:

the memory cell further comprises an access mechanism coupled to a wordline; and when the wordline is asserted, the access mechanism couples the first transistor of the memory cell to a first bitline, and the second transistor of the memory cell to a second bitline.

9. The method of claim 8, wherein:

reading the memory cell comprises:

precharging the first bitline to a first precharge voltage;

precharging the second bitline to a second precharge voltage;

asserting the wordline to enable the access mechanism;

sensing a first logic value from the memory cell if the first bitline is substantially discharged via the first transistor; and sensing a second logic value from the memory cell if the second bitline is substantially discharged via the second transistor;

and the first and second logic values are configured to be complementary to each other.

10. The method of claim 9, wherein:

reading from the memory cell further comprises:

de-asserting the wordline to disable the access mechanism.

11. The method of claim 9, wherein:

the first and second precharge voltages are similar to each other.

12. The method of claim 9, wherein:

sensing the first logic value further comprises:

disabling the second transistor, while the first bitline is discharged via the first transistor, to restrict the second bitline from substantially discharging via the second transistor;

and sensing the second logic value further comprises:

disabling the first transistor, while the second bitline is discharged via the second transistor, to restrict the first bitline from substantially discharging via the first transistor.

13. The method of claim 9, wherein:

sensing the first logic value further comprises:

sensing the first logic value even if the second bitline is partially discharged via the second transistor; and sensing the second logic value further comprises:

sensing the second logic value even if the first bitline is partially discharged via the first transistor.

14. The method of claim 9, wherein:

the first bitline is configured to couple, via the access mechanism, to a first terminal of the first transistor and to the second control terminal of the second transistor;

the second bitline is configured to couple, via the access mechanism, to a first terminal of the second transistor and to the first control terminal of the first transistor;

when the second threshold voltage of the second transistor is greater than the first threshold voltage of the first transistor, sensing the first logic value comprises:

substantially discharging the first bitline via the first terminal of the first transistor; and disabling the second transistor to restrict discharge of the second bitline when the second control terminal of the second transistor is turned off by the discharge of the first bitline;

and when the first threshold voltage of the first transistor is greater than the second threshold voltage of the second transistor, sensing the second logic value comprises:

substantially discharging the second bitline via the first terminal of the second transistor; and disabling the first transistor to restrict discharge of the first bitline when the first control terminal of the first transistor is turned off by the discharge of the second bitline.

15. The method of claim 8, wherein:

a target transistor of the memory cell comprises one of the first or second transistors of the memory cell;

a nontarget transistor of the memory cell comprises another one of the first or second transistors of the memory cell; and writing to the memory cell comprises:

determining the target transistor of the memory cell based on a target state for the memory cell; and degrading a threshold voltage of the target transistor of the memory cell via a control terminal of the target transistor.

16. The method of claim 15, wherein:

degrading the threshold voltage of the target transistor comprises:

degrading the threshold voltage of the target transistor until the threshold voltage of the target transistor is degraded further than a threshold voltage of the nontarget transistor of the memory cell.

17. The method of claim 15, wherein:

degrading the threshold voltage of the target transistor comprises:

applying an iterative write mechanism comprising:

routing a write voltage to the control terminal of the target transistor; and comparing the threshold voltages of the target and nontarget transistors;

and
repeating the iterative write mechanism until the threshold voltage of the target transistor is degraded further than the threshold voltage of the nontarget transistor.

18. The method of claim 17, wherein:
degrading the threshold voltage of the target transistor further comprises:
repeating the iterative writing mechanism at least once after the threshold voltage of the target transistor is degraded further than the threshold voltage of the nontarget transistor.

19. The method of claim 15, wherein:
degrading the threshold voltage of the target transistor comprises:
continuously applying a write voltage to the control terminal of the target transistor until the threshold voltage of the target transistor is degraded further than the threshold voltage of the nontarget transistor.

20. The method of claim 15, wherein:
writing to the memory cell comprises:
when the target transistor is the first transistor:
asserting the second bitline at a write voltage; and
de-asserting the first bitline;
when the target transistor is the second transistor:
asserting the first bitline at the write voltage; and
de-asserting the second bitline;
and
asserting the wordline throughout a write time to stress the control terminal of the target transistor.

21. The method of claim 20, wherein:
asserting the wordline throughout the write time to stress the control terminal of the target transistor further comprises:
routing the write voltage to the control terminal of the target transistor via the access mechanism; and
causing the write voltage to degrade the threshold voltage of the target transistor.

22. The method of claim 21, wherein:
routing the write voltage to the control terminal of the target transistor comprises:
when the target transistor is the second transistor of the memory cell:
routing the write voltage from the first bitline through a first access transistor of the access mechanism to the second control terminal of the second transistor;
and
when the target transistor is the first transistor of the memory cell:
routing the write voltage from the second bitline through a second access transistor of the access mechanism to the first control terminal of the first transistor.

23. The method of claim 15, wherein:
determining the target transistor comprises:
sensing a prewrite state of the memory cell;
when the prewrite state does not match the target state of the memory cell:
selecting the first transistor as the target transistor when the prewrite state of the memory cell is in a de-asserted mode; and
selecting the second transistor as the target transistor when the prewrite state of the memory cell is in an asserted mode;
and
when the prewrite state matches the target state of the memory cell:
terminating the writing to the memory cell.

24. The method of claim 15, wherein:
writing to the memory cell comprises at least one of:
generating a charge injection into a gate insulator of the target transistor; or
generating defect states in a channel of the target transistor.

25. The method of claim 1, further comprising:
maintaining the logic state of the memory cell when the memory cell is unpowered.

26. A memory circuit comprising:
a memory cell comprising:
a first transistor comprising a first threshold voltage; and
a second transistor comprising a second threshold voltage;
wherein:
the first transistor further comprises a first control terminal;
the second transistor further comprises a second control terminal;
the first and second transistors are cross-coupled together;
a difference between the first and second threshold voltages corresponds to a logic state of the memory cell;
the first and second transistors comprise thin film transistors; and
the first and second threshold voltages are degradable relative to each other to alter the difference between the first and second threshold voltages and to alter the logic state of the memory cell.

27. The memory circuit of claim 26, wherein:
the difference between the first and second threshold voltages remains when the memory circuit is unpowered.

28. The memory circuit of claim 26, wherein:
the first and second transistors are configured to withstand at least approximately 2000 read cycles before the difference between the first and second threshold voltages is sufficiently altered to toggle the logic state of the memory cell; and
at least one of the first or second transistors is exposed to a read voltage at each read cycle.

29. The memory circuit of claim 26, wherein:
the first and second transistors are configured to withstand at least approximately 10 to 1000 write cycles before the memory cell becomes inoperable; and
at least one of the first or second transistors is exposed to a write voltage at each write cycle.

30. The memory circuit of claim 26, further comprising:
a wordline; a bitline; and a memory array;
wherein:
the memory array comprises a plurality of memory cells;
the wordline is configured to activate at least a portion of the plurality of memory cells;
the portion of the plurality of memory cells is accessible via the bitline when activated by the wordline; and
the plurality of memory cells comprises the memory cell.

31. The memory circuit of claim 26, wherein:
the first threshold voltage of the first transistor is configured to degrade, when the first control terminal is exposed to a write voltage, due to at least one of:
a charge injection into a gate insulator of the first transistor; or a generation of defect states in a channel of the first transistor;
and
the second threshold voltage of the second transistor is configured to degrade, when the second control terminal is exposed to the write voltage, due to at least one of:
a charge injection into a gate insulator of the second transistor; or
a generation of defect states in a channel of the second transistor.

32. The memory circuit of claim 26, wherein:
a first terminal of the first transistor is coupled to the second control terminal of the second transistor; and
a first terminal of the second transistor is coupled to the first control terminal of the first transistor.

33. The memory circuit of claim 32, further comprising:
a first bitline; a second bitline; and a wordline;
wherein:
the memory cell further comprises an access mechanism comprising:
a third transistor; and
a fourth transistor;
a control terminal of the third transistor is coupled to the wordline;
a first terminal of the third transistor is coupled to the first bitline;
a second terminal of the third transistor is coupled to the first terminal of the first transistor and to the second control terminal of the second transistor;
a control terminal of the fourth transistor is coupled to the wordline;
a first terminal of the fourth transistor is coupled to the second bitline; and
a second terminal of the fourth transistor is coupled to the first terminal of the second transistor and to the first control terminal of the first transistor.

34. The memory circuit of claim 33, further comprising:
a first power node; a chargeline;
a fifth transistor; and a sixth transistor;
wherein:
the first power node comprises one of:
a ground path; or
a powersource path;
a first terminal of the fifth transistor is coupled to the first power node;
a control terminal of the fifth transistor is coupled to the chargeline;
a second terminal of the fifth transistor is coupled to the first bitline;
a first terminal of the sixth transistor is coupled to the first power node;
a control terminal of the sixth transistor is coupled to the chargeline; and
a second terminal of the sixth transistor is coupled to the second bitline.

35. The memory circuit of claim 34, wherein:
the first, second, third, fourth, fifth, and sixth transistors comprise NMOS transistors;
a second terminal of the first transistor and a second terminal of the second transistor are coupled to a second power node;
the first power node comprises the powersource path; and
the second power node comprises the ground path.

36. The memory circuit of claim 34, wherein:
the first, second, third, fourth, fifth, and sixth transistors comprise PMOS transistors;
a second terminal of the first transistor and a second terminal of the second transistor are coupled to a second power node;
the first power node comprises the ground path; and
the second power node comprises the powersource path.

37. The memory circuit of claim 33, further comprising:
a readline; a first bitpath; a second bitpath;
an seventh transistor; and an eight transistor;
wherein:
a first terminal of the seventh transistor is coupled to the first bitline;
a control terminal of the seventh transistor is coupled to the readline;
a second terminal of the seventh transistor is coupled to the first bitpath;
a first terminal of the eight transistor is coupled to the second bitline;
a control terminal of the eight transistor is coupled to the readline; and
a second terminal of the eight transistor is coupled to the second bitpath.

38. The memory circuit of claim 33, further comprising:
a writeline; a first datapath; a second datapath;
a ninth transistor; and a tenth transistor;
wherein:
a first terminal of the ninth transistor is coupled to the first bitline;
a control terminal of the ninth transistor is coupled to the writeline;
a second terminal of the ninth transistor is coupled to the first datapath;
a first terminal of the tenth transistor is coupled to the second bitline;
a control terminal of the tenth transistor is coupled to the writeline; and
a second terminal of the tenth transistor is coupled to the second datapath.

39. A method for providing an integrated circuit, the method comprising:
providing a memory cell of the integrated circuit;
wherein:
providing the memory cell of the integrated circuit comprises:
providing a first transistor comprising:
a first threshold voltage and a first control terminal;
providing a second transistor comprising:
a second threshold voltage and a second control terminal;
and
cross-coupling the first and second transistors together;
a difference between the first and second threshold voltages corresponds to a logic state of the memory cell;
the first and second transistors comprise thin film transistors; and
the first and second threshold voltages are degradable relative to each other to alter the difference between the first and second threshold voltages and to alter the logic state of the memory cell.

40. The method of claim 39, wherein:
providing the memory cell further comprises:
coupling a first terminal of the first transistor to the second control terminal of the second transistor;
coupling a first terminal of the second transistor to the first control terminal of the first transistor;

coupling a second terminal of the first transistor and a second terminal of the second transistor to a powernode comprising at least one of:
  a ground path; or
  a powersource path;
and
configuring the first and second transitors to retain the difference between the first and second threshold voltages when the memory circuit is unpowered.

* * * * *